(12) United States Patent
Huang

(10) Patent No.: US 6,830,383 B2
(45) Date of Patent: Dec. 14, 2004

(54) SMALL FORM FACTOR PLUGGABLE OPTOELECTRONIC TRANSCEIVER MODULE

(75) Inventor: Nan Tsung Huang, Tu-Chen (TW)

(73) Assignee: Hon Hai Precision Ind. Co., LTD, Taipei Hsien (TW)

(*) Notice: Subject to any disclaimer, the term of this patent is extended or adjusted under 35 U.S.C. 154(b) by 159 days.

(21) Appl. No.: 10/084,526

(22) Filed: Feb. 26, 2002

(65) Prior Publication Data

US 2003/0072540 A1 Apr. 17, 2003

(30) Foreign Application Priority Data

Oct. 17, 2001 (TW) .................................. 90217729 U

(51) Int. Cl.[7] .............................. H05K 7/00; H05K 7/14
(52) U.S. Cl. .............................. 385/92; 385/88; 385/89; 361/736
(58) Field of Search ..................... 385/92–94, 88–90, 385/49, 56, 14; 361/816, 740, 754, 736

(56) References Cited

U.S. PATENT DOCUMENTS

| | | | | |
|---|---|---|---|---|
| 5,117,476 A | * | 5/1992 | Yingst et al. | 385/88 |
| 6,178,096 B1 | * | 1/2001 | Flickinger et al. | 361/816 |
| 6,335,869 B1 | * | 1/2002 | Branch et al. | 361/816 |
| 6,358,066 B1 | * | 3/2002 | Gilliland et al. | 439/76.1 |
| 6,461,058 B1 | * | 10/2002 | Birch et al. | 385/92 |
| 6,483,711 B1 | * | 11/2002 | Huang | 361/736 |
| 6,540,412 B2 | * | 4/2003 | Yonemura et al. | 385/88 |
| 6,558,191 B2 | * | 5/2003 | Bright et al. | 439/541.5 |

* cited by examiner

Primary Examiner—Joseph Williams
Assistant Examiner—Dalei Dong
(74) Attorney, Agent, or Firm—Wei Te Chung

(57) ABSTRACT

A small form factor pluggable optoelectronic transceiver module includes top and bottom housings (1, 2), a chassis (3), a receptacle (4), a PCB (5), an optoelectronic subassembly (6), and a shielding shell (9). The optoelectronic subassembly is received in the receptacle. The shielding shell is fixed on the PCB, and encases a transmitting circuit on the PCB. The chassis is attached to the PCB with screws, and accommodates and protects the PCB. The top housing is attached to the chassis and the receptacle. The top and bottom housings are attached together, encapsulating therein the receptacle, the chassis, the PCB and the shielding shell. The shielding shell provides EMI protection and ESD shielding, and reduces electrical crosstalk. The module also forms multiple grounding paths between a grounding circuit of the PCB and the top and bottom housings.

10 Claims, 5 Drawing Sheets

SMALL FORM FACTOR PLUGGABLE OPTOELECTRONIC TRANSCEIVER MODULE

BACKGROUND OF THE INVENTION

1. Field of the Invention

This invention relates to small form factor pluggable optical transceiver modules, and particularly to such modules which provide protection from electromagnetic interference (EMI) and electrostatic discharge (ESD), and which reduce electrical crosstalk between transmitting circuits and receiving circuits thereof.

2. Description of the Related Art

Optoelectronic transceiver modules are widely used for bi-directional transmission of data between an electrical interface and an optical data link. The module receives electrically encoded data signals which are converted into optical signals and transmitted over the optical data link. The module also receives optically encoded data signals which are converted into electrical signals and transmitted onto the electrical interface.

High transmission frequencies utilized in fiber optic communications generate significant electrical crosstalk between received and transmitted signals. Additionally, high frequency operation of fiber optic modules generates proportionately high electromagnetic interference (EMI). Shielding of electrical components of a module is required to reduce EMI. A metal shield is commonly attached to a substrate of the module and connected to a ground source.

U.S. Pat. No. 6,213,651 B1 discloses a small form factor optoelectronic transceiver module for reducing EMI and electrical crosstalk between printed circuit boards (PCBs). The transmitting and receiving circuits are implemented on two separate and substantially parallel PCBs. The transmitter PCB and the receiver PCB are also offset from each other and separated by a ground plane to minimize electrical crosstalk. Using separate PCBs reduces the size of the module, and allows the light transmitting diode and the light receiving diode to be mounted substantially face to face. However, the ground plane does not effectively isolate the transmitting circuit from the receiving circuit. The level of electrical crosstalk is still unduly high.

U.S. Pat. No. 5,047,835 discloses another conventional optoelectronic transceiver module. A pair of molded plastic frame housings encases the PCB. A metallic heat sink on the underside of a lid of the package provides heat removal, EMI protection and ESD shielding for the electronic components. The heat sink further includes a central metallic partition, which divides the package into separate regions and separates the circuitry associated with the optical subassembly. This isolation reduces electrical crosstalk between components. However, the module still does not have effective shielding.

In view of the above, there is a need for an optoelectronic transceiver module which not only has effective isolation between transmitting circuits and receiving circuits but also effective ESD shielding.

SUMMARY OF THE INVENTION

A primary object of the present invention is to provide a small form factor pluggable optoelectronic transceiver module having a metallic element for EMI protection and ESD shielding, and for reducing electrical crosstalk.

Another object of the present invention is to provide a small form factor pluggable optoelectronic transceiver module having components which are fixed together easily, quickly and reliably.

To achieve the above objects, a small form factor pluggable optoelectronic transceiver module of the present invention comprises top and bottom housings, a chassis, a receptacle, a PCB, an optoelectronic subassembly and a shielding shell. The optoelectronic subassembly is received in the receptacle. Conductive leads of the optoelectronic subassembly are soldered to the PCB. The shielding shell is fixed on the PCB, and encases a transmitting circuit on the PCB. The chassis is attached to the PCB with screws, and accommodates and protects the PCB. The top housing is attached to the chassis and the receptacle. The top and bottom housings are attached together, encapsulating therein the receptacle, the chassis, the PCB and the shielding shell. The shielding shell provides EMI protection and ESD shielding, and reduces electrical crosstalk. The module also forms multiple grounding paths between a grounding circuit of the PCB and the top and bottom housings.

Other objects, advantages and novel features of the present invention will be drawn from the following detailed description of preferred embodiments of the present invention with the attached drawings, in which:

DETAILED DESCRIPTION OF THE INVENTION

Figure 1:
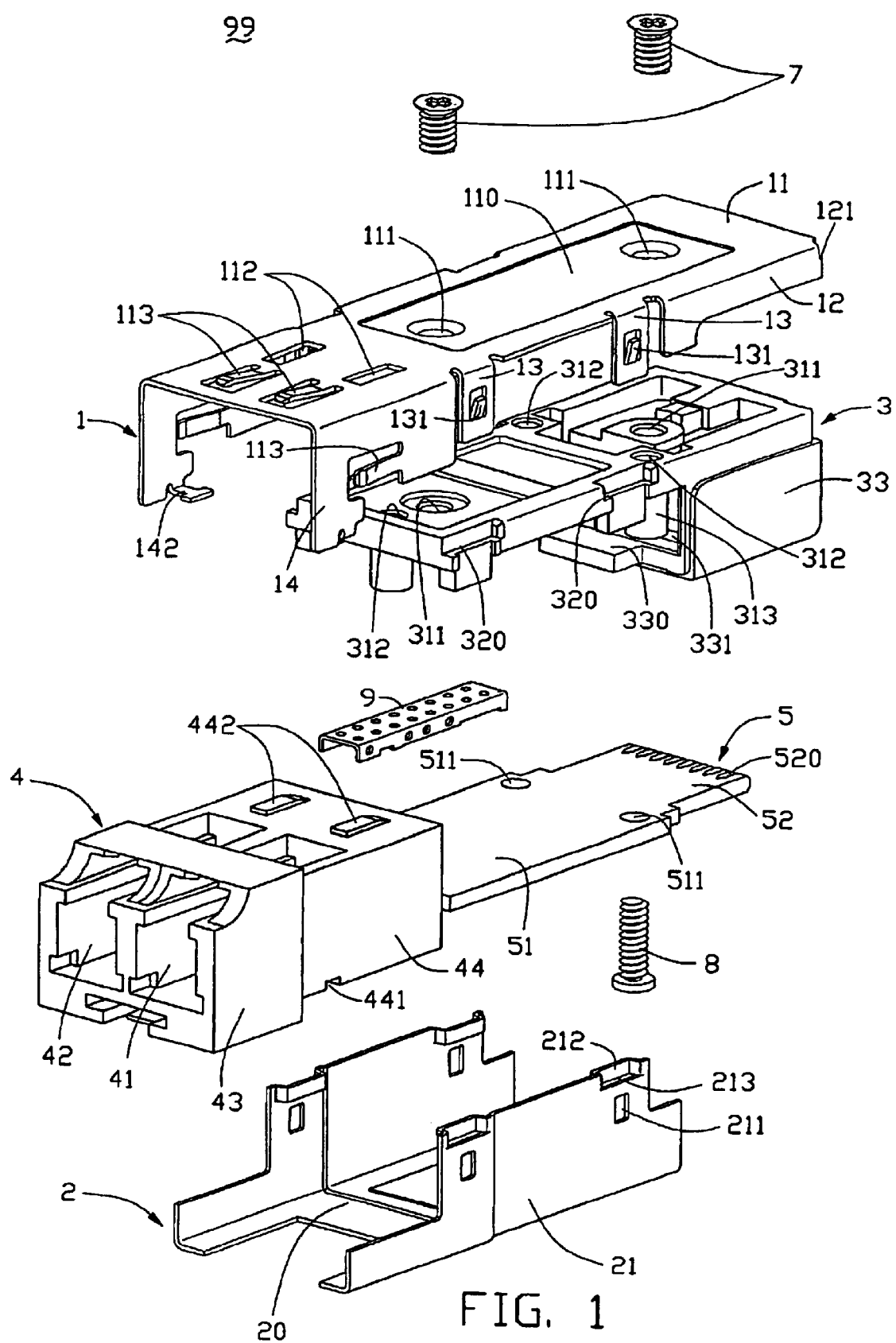
FIG. 1 is an exploded perspective view of an optoelectronic transceiver module in accordance with a preferred embodiment of the present invention.

Referring to FIG. 1, an optoelectronic transceiver module 99 in accordance with a preferred embodiment of the present invention has a top housing 1, a bottom housing 2, a chassis 3, a receptacle 4, a printed circuit board (PCB) 5, an optoelectronic subassembly 6 (see FIG. 3), and a shielding shell 9.

Figure 3:
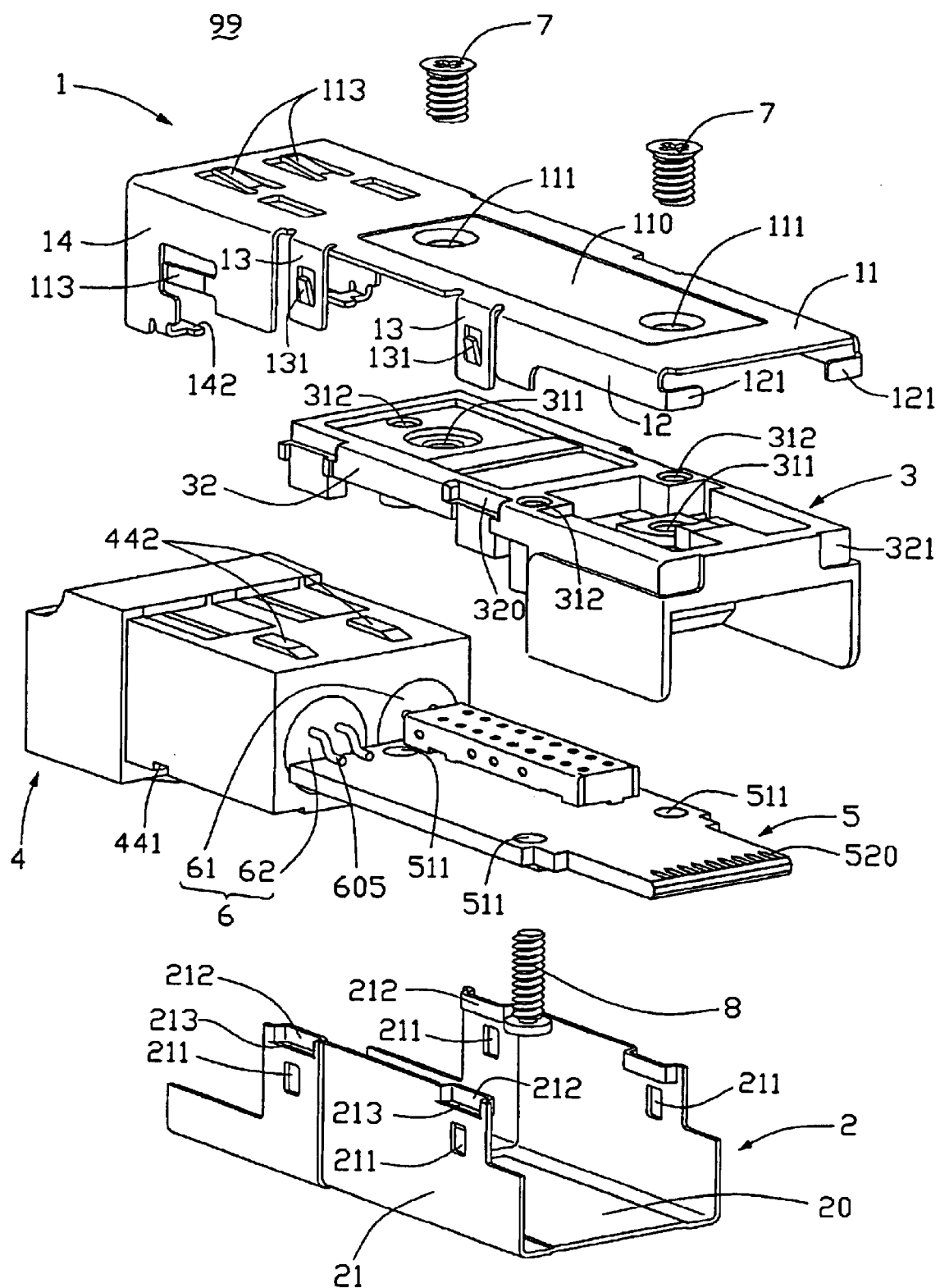
FIG. 3 is similar to FIG. 1, but viewed from still another aspect.

The receptacle 4 is generally shaped like an oblong box. The receptacle 4 comprises a front portion 43 and a rear portion 44. A profile of the front portion 43 is larger than a corresponding profile of the rear portion 44. Thus a rear step (not labeled) is defined on the front portion 43 around a periphery of a junction of the front and rear portions 43, 44, for abutting the top housing 1. Referring also to FIG. 3, two openings 41, 42 are respectively defined though both the front portion 43 and rear portion 44. Rear portions of the openings 41, 42 are for receiving the optoelectronic subassembly 6, and front portions of the openings 41, 42 are for connecting with an optical connector (not shown) to output optical signals. The optoelectronic subassembly 6 comprises a transceiver. The transceiver comprises a transmitter 61 and a receiver 62. The transmitter 61 may typically be a laser diode (LD) or light emitting diode (LED), and the receiver 62 may typically be a photo diode. A plurality of conductive leads 605 extends from a rear of the transceiver, for soldering to the PCB 5. Two T-shaped grooves 441 are defined in a bottom surface of the rear portion 44 of the receptacle 4, for engagement of the receptacle 4 with the bottom housing 2. A pair of protuberances 442 is formed on a top surface of the receptacle 4.

Figure 2:
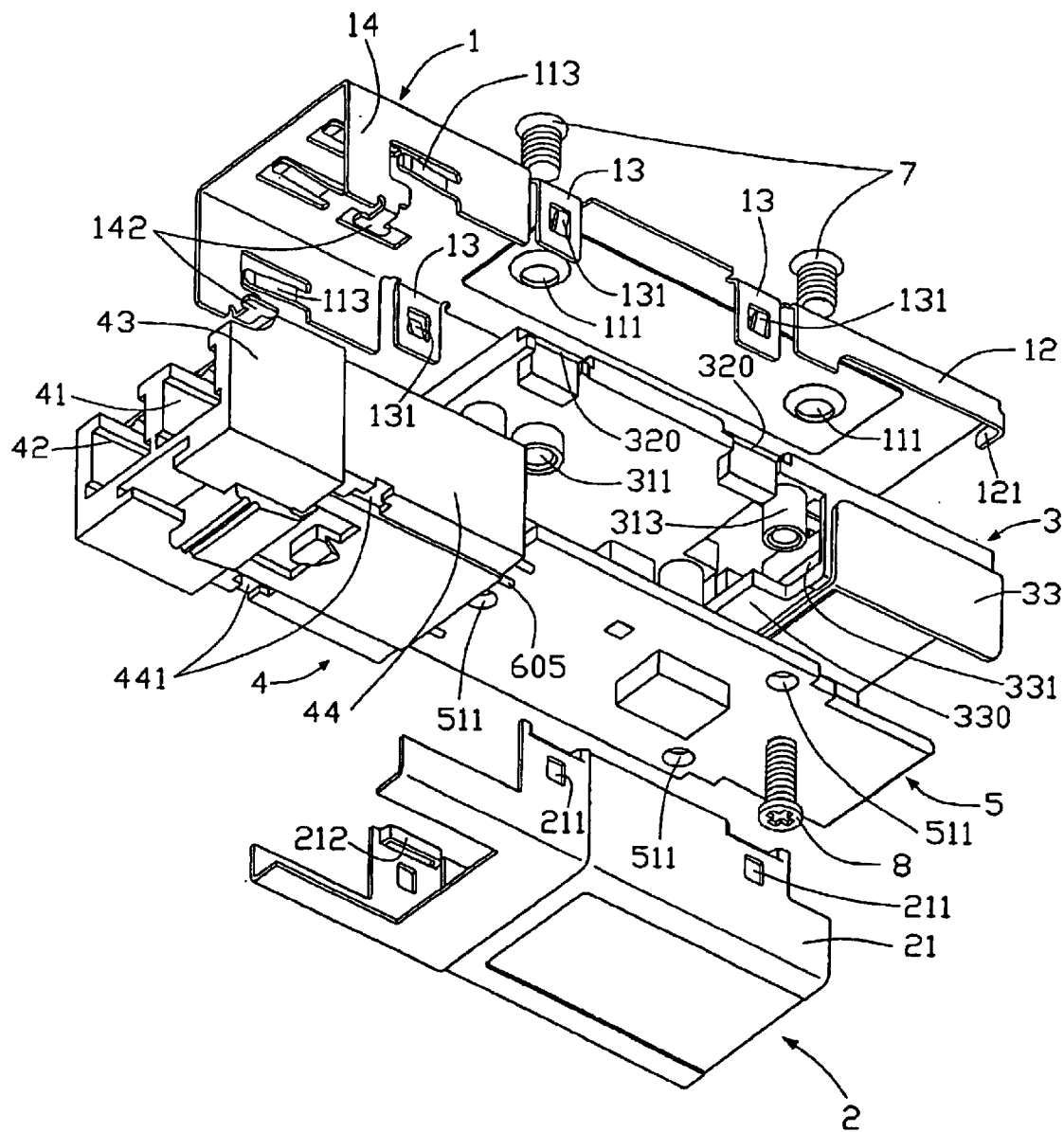
FIG. 2 is similar to FIG. 1, but viewed from another aspect.

Referring also to FIG. 2, the PCB 5 has a wide front section 51 and a narrow rear section 52. Three positioning holes 511 are defined in the PCB 5, in the vicinity of three edges thereof respectively. The PCB 5 at the positioning holes 511 is coated with conductive material, and the conductive material is connected with a grounding circuit (not labeled) of the PCB 5. A transmitting circuit (not labeled) and a receiving circuit (not labeled) are disposed on the front section 51 of the PCB 5, for respective electrical connection with the transmitter 61 and receiver 62 of the optoelectronic subassembly 6. The rear section 52 of the PCB 5 has a row of electrical contacts 520 at a rear end thereof, for electrical connection of the PCB 5 with an electrical connector (not shown).

Figure 4:
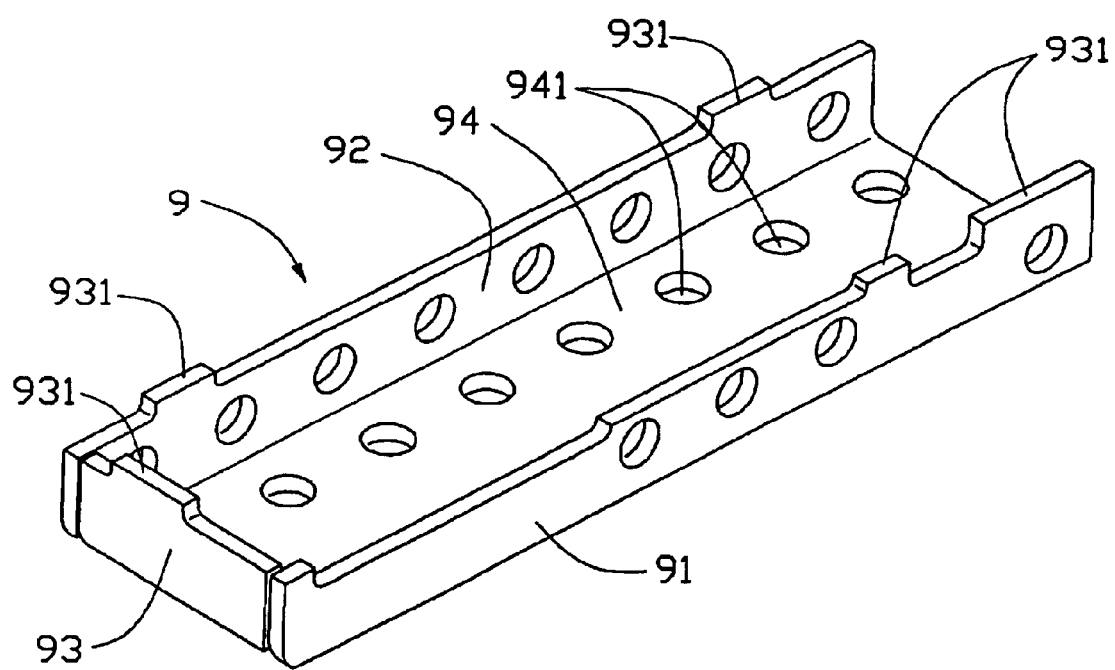
FIG. 4 is a perspective view of a shielding shell of the optoelectronic transceiver module of FIG. 1.

Referring particularly to FIG. 4, the shielding shell 9 comprises two side walls 91, 92, a top cover 94 and a rear wall 93. A plurality of ventilating holes 941 is defined in the top cover 94 and side walls 91, 92. A plurality of engaging tabs 931 depends from the side walls 91, 92 and rear wall 93, for mechanically and electrically engaging with the grounding circuit (not labeled) of the PCB 5.

Referring particularly to FIG. 1, the chassis 3 is preferably made of metal but may be made of plastic or other suitable material. The chassis 3 is generally shaped like an oblong box, for accommodating and protecting the PCB 5. Three poles 313 depend from a bottom face of the chassis 3. Three screw holes 312 are defined through both a top face of the chassis 3 and the three poles 313 respectively. The screw holes 312 correspond to the positioning holes 511 of the PCB 5. A rear of the chassis 3 forms a seat 33. A support plate 330 extends forwardly from a bottom of the seat 33. Two spaced screw holes 311 are defined in the chassis 3. The chassis 3 has a pair of opposite side walls 32. Two spaced recesses 320 are defined in a top of each side wall 32, for engagement of the chassis 3 with the bottom housing 2. A pair of depressions 321 (see FIG. 3) is respectively defined in opposite sides of a top portion of a rear end of the chassis 3. Three fastening components, such as screws 8 (only one shown), are for fixing the PCB 5 on the chassis 3.

The bottom housing 2 is made of metal, and has a generally U-shaped configuration. The bottom housing 2 has a rectangular bottom wall 20, and two side walls 21 extending perpendicularly upwardly from the bottom wall 20. Two protrusions 212 are inwardly formed at front and rear ends respectively of a top of each side wall 21, for engaging in the recesses 320 of the chassis 3. A slot 213 is defined below each protrusion 212 of each side wall 32. A rectangular opening 211 is defined in each side wall 21 below each slot 213. The slots 213 and the rectangular openings 211 are for mating with the top housing 1.

The top housing 1 is made of metal, and has a top wall 11. A shallow trough 110 is formed at a middle portion of the top wall 11. Two recessed positioning holes 111 are defined in the trough 110, corresponding to the screw holes 311 of the chassis 3. A pair of parallel grounding tabs 113 is formed near a front end of the top wall 11. A pair of parallel rectangular openings 112 is defined in the top wall 11 between the grounding tabs 113 and the trough 110, corresponding to the protuberances 442 of the receptacle 4. A pair of forward side walls 14 respectively depends from opposite sides of a front portion of the top wall 11. A pair of rearward side walls 12 respectively depends from opposite sides of a rear portion of the top wall 11. Two pairs of locking tabs 13 respectively depend from opposite sides of the top wall 11, between the forward and rearward side walls 14, 12. A T-shaped flap 142 is inwardly formed at a bottom of each forward side wall 14, for engaging in the corresponding T-shape groove 441 of the receptacle 4. Each forward side wall 14 has a grounding tab 113 formed therein. A tab 121 (best seen in FIG. 3) extends inwardly from a rear end of each rearward side wall 12, for engaging in the corresponding depression 321 of the chassis 3. Each locking tab 13 is a rectangular plate, and is sized to correspond to each slot 213 of the bottom housing 2. A spring tongue 131 is outwardly formed at a center of each locking tab 13. A lower end of each spring tongue 131 is integrally joined with the locking tab 13, and an upper end of each spring tongue 131 protrudes outwardly from the locking tab 13. Two fastening components, such as screws 7, are for attaching the top housing 1 to the chassis 3.

Figure 5:
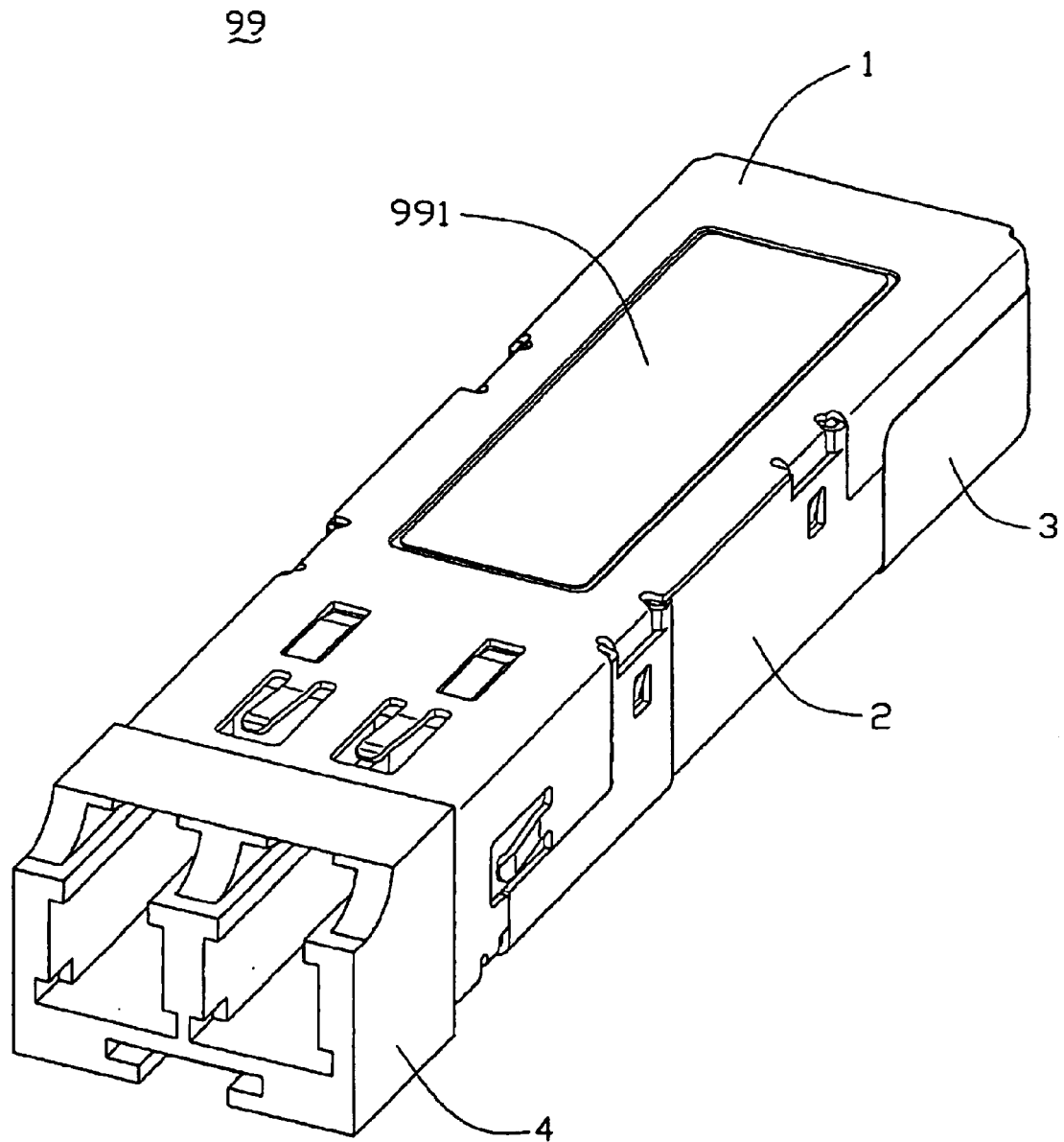
FIG. 5 is an assembled view of FIG. 1, together with a labeling tape attached on the optoelectronic transceiver module.

Referring to FIG. 5, a labeling tape 991 is for attachment to the optoelectronic transceiver module 99 after assembly thereof.

In assembly of the optoelectronic transceiver module 99, the transmitter 61 and receiver 62 are firstly inserted into the openings 41, 42 of the receptacle 4. The conductive leads 605 of the transmitter 61 and receiver 62 are respectively soldered to the transmitting and receiving circuits (not labeled) on the front section 51 of the PCB 5, to establish electrical contact between the optoelectronic subassembly 6 and the PCB 5. The shielding shell 9 is then fixed to the PCB 5 to encase the transmitting circuit (not labeled) thereon. The engaging tabs 931 of the shielding shell 9 are engaged with the PCB 5 using solder or conductive fiber. The shielding shell 9 is thereby electrically connected with the grounding circuit (not labeled) of the PCB 5. The PCB 5 and chassis 3 are then attached together. The rear section 52 of the PCB 5 is inserted into the seat 33 of the chassis 3. The poles 313 of the chassis 3 press down on the PCB 5, and the support plate 330 of the chassis 3 supports the PCB 5 by abutting against a bottom face thereof. The screws 8 are extended through the positioning holes 511 of the PCB 5 to threadedly engage in the screw holes 312 of the poles 313.

The top housing 1 is then attached to the combined receptacle 4, PCB 5 and chassis 3. A front edge of the top housing 1 abuts the step (not labeled) of the front portion 43 of the receptacle 4. The screws 7 are extended through the positioning holes 111 of the top housing 1 to threadedly engage in the screw holes 311 of the chassis 3. The protuberances 442 of the receptacle 4 are received in the rectangular openings 112 of the top housing 1. The T-shaped flaps 142 of the top housing 1 are engaged in the T-shaped grooves 441 of the receptacle 4. Finally, the bottom housing 2 is attached to the combined receptacle 4, PCB 5, chassis 3 and top housing 1. The locking tabs 13 of the top housing 1 are extended through the slots 213 of the bottom housing 2 until the spring tongues 131 of the locking tabs 13 engage in the openings 211 of the bottom housing 2. The protrusions 212 of the bottom housing 2 are engaged in the recesses 320 of the chassis 3. FIG. 5 shows the finally assembled optoelectronic transceiver module 99. The top and bottom housings 1, 2 encapsulate the receptacle 4, the chassis 3, the PCB 5 and the shielding shell 9. The labeling tape 991 is glued to the trough 110 of the top housing 1, to show information about the optoelectronic transceiver module 99 and to cover the screws 7.

In the preferred embodiment of the present invention, the transmitting and receiving circuits on the PCB 5 are shieldingly separated from each other by the shielding shell 9. The shielding shell 9 accordingly minimizes electrical crosstalk.

Furthermore, the chassis 3 of the optoelectronic transceiver module 99 is electrically connected with the grounding circuit (not labeled) of the PCB 5 via the screws 8 which engage with the conductive material coated on the PCB 5 at the positioning holes 511. The top and bottom housings 1, 2 electrically contact with the chassis 3. The optoelectronic transceiver module 99 thus forms a grounding path between the grounding circuit (not labeled) of the PCB 5 and the top and bottom housings 1, 2. Therefore any static charge which develops on the top or bottom housings 1, 2 is effectively dissipated.

In an alternative embodiment of the present invention, a pair of shielding shells is fixed to the PCB 5 to encase the transmitting circuit (not labeled) on the PCB 5.

In a further alternative embodiment of the present invention, a pair of shielding shells 9 is fixed to the PCB 5 to respectively encase the transmitting circuit (not labeled) and receiving circuit (not labeled) on the PCB 5.

It should be understood that various changes and modifications to the presently preferred embodiments described herein will be apparent to those skilled in the art. Such changes and modifications may be made without departing from the spirit and scope of the present invention and without diminishing the present invention's advantages. Thus, it is intended that such changes and modifications be covered by the appended claims.

What is claimed is:

1. A small form factor pluggable optoelectronic transceiver module comprising:

an optoelectronic subassembly for receiving and sending optical signals;

a receptacle receiving the optoelectronic subassembly and including a top surface having at least one protuberance and a bottom surface having at least two grooves;

a printed circuit board electrically contacting with the optoelectronic subassembly;

a chassis for fixing and holding the printed circuit board, a pair of depressions being defined in a rear end of the chassis;

a first housing including a top wall, a pair of forward side walls, a pair of rearward side walls, and at least one locking tab, at least one opening being defined in the top wall and engagingly receiving the at least one protuberance of the receptacle, a bottom of each forward side wall having at least one flap engaging in the grooves of the receptacle, a tab being formed at a rear end of each rearward side wall and engaging in a corresponding depression of the chassis;

a second housing fixed to the first housing by the at least one locking tab to encapsulate the printed circuit board and the chassis; and a shielding shell attached to the printed circuit board to prevent crosstalk.

2. The module as described in claim 1, wherein the shielding shell is stamped from a single metallic plate, and includes a pair of side walls, a top cover, a rear wall and a recessed portion formed in one side wall.

3. The module as described in claim 1, wherein the optoelectronic subassembly includes a laser diode and a photo diode.

4. The module as described in claim 1, wherein the optoelectronic subassembly includes conductive leads soldered to the printed circuit board to establish electrical contact between the optoelectronic subassembly and the printed circuit board.

5. The module as described in claim 1, wherein the at least one locking tab of the first housing includes at least one spring tongue at a center thereof.

6. The module as described in claim 5, wherein the second housing includes a pair of side walls, at least one opening is defined in at least one of the side walls of the second housing, and the at least one opening engagingly receives the at least one spring tongue of the at least one locking tab of the first housing.

7. The module as described in claim 6, wherein the at least one protrusion is formed on at least one of the side walls of the second housing, the chassis has a pair of side walls, at least one recess is defined in at least one of the side walls of the chassis, the at least one recess receiving the at least one protrusion of the second housing.

8. The module as described in claim 1, wherein a plurality of engaging tabs extends from the side walls, rear wall and recessed portion of the shielding shell, and the engaging tabs are engaged with the printed circuit board.

9. The module as described in claim 8, wherein the engaging tabs are soldered to the printed circuit board.

10. The module as described in claim 8, wherein the engaging tabs are engaged with the printed circuit board with conductive fiber.

\* \* \* \* \*